(12) United States Patent
Otsuka et al.

(10) Patent No.: US 7,675,076 B2
(45) Date of Patent: *Mar. 9, 2010

(54) NITRIDE-BASED SEMICONDUCTOR DEVICE OF REDUCED VOLTAGE DROP

(75) Inventors: Koji Otsuka, Niiza (JP); Tetsuji Moku, Niiza (JP); Junji Sato, Niiza (JP); Yoshiki Tada, Niiza (JP); Takashi Yoshida, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/375,964

(22) Filed: Mar. 15, 2006

(65) Prior Publication Data

US 2006/0157730 A1    Jul. 20, 2006

Related U.S. Application Data

(63) Continuation of application No. PCT/JP2004/013819, filed on Sep. 22, 2004.

(30) Foreign Application Priority Data

Sep. 24, 2003   (JP) ............................. 2003-331881
Mar. 26, 2004   (JP) ............................. 2004-093515

(51) Int. Cl.
*H01L 33/00*   (2006.01)

(52) U.S. Cl. .............. 257/96; 257/183.1; 257/200; 257/E33.045; 257/E33.048

(58) Field of Classification Search ............... 257/96, 257/103, 183.1, 200, 242, 262, E33.064, 257/94, E33.045, E33.048; 438/46

See application file for complete search history.

(56) References Cited

U.S. PATENT DOCUMENTS

| 5,679,965 | A  | * | 10/1997 | Schetzina ............... 257/103 |
| 5,858,826 | A  | * | 1/1999  | Lee et al. ............... 438/228 |
| 6,573,558 | B2 | * | 6/2003  | Disney ................... 257/328 |
| 6,586,774 | B2 | * | 7/2003  | Ishibashi et al. ........ 257/94 |
| 6,586,781 | B2 | * | 7/2003  | Wu et al. ................ 257/194 |

(Continued)

FOREIGN PATENT DOCUMENTS

JP           11-17742  A       7/1999

(Continued)

OTHER PUBLICATIONS

A. Krost et al., "Heteroepitaxy of GaN on Si(111)", 2002, IEEE, pp. 41-47.*

(Continued)

*Primary Examiner*—Minh-Loan T Tran
*Assistant Examiner*—W. Wendy Kuo
(74) *Attorney, Agent, or Firm*—Woodcock Washburn LLP

(57) ABSTRACT

A light-emitting device has a main semiconductor region formed via an n-type AlInGaN buffer region on a p-type silicon substrate, the latter being sufficiently electroconductive to provide part of the current path through the device. Constituting the primary working part of the LED, the main semiconductor region comprises an n-type GaN layer, an active layer, and a p-type GaN layer, which are successively epitaxially grown in that order on the buffer region. A heterojunction is created between p-type substrate and n-type buffer region. Carrier transportation from substrate to buffer region is expedited by the interface levels of the heterojunction, with a consequent reduction of the drive voltage requirement of the LED.

14 Claims, 5 Drawing Sheets

U.S. PATENT DOCUMENTS

| | | | |
|---|---|---|---|
| 6,617,060 B2 * | 9/2003 | Weeks et al. | 428/698 |
| 6,759,689 B2 * | 7/2004 | Adomi et al. | 257/98 |
| 2001/0052601 A1 * | 12/2001 | Onishi et al. | 257/138 |
| 2002/0045286 A1 * | 4/2002 | Koide et al. | 438/46 |
| 2002/0093030 A1 * | 7/2002 | Hsu et al. | 257/162 |
| 2003/0020061 A1 * | 1/2003 | Emerson et al. | 257/14 |
| 2003/0160264 A1 | 8/2003 | Yagi et al. | 257/183 |
| 2006/0118824 A1 * | 6/2006 | Otsuka et al. | 257/194 |
| 2006/0145177 A1 * | 7/2006 | Hagimoto et al. | 257/99 |

FOREIGN PATENT DOCUMENTS

| | | |
|---|---|---|
| JP | 2000-4047 A | 1/2000 |
| JP | 2001-44209 A | 2/2001 |
| JP | 2002-208729 A | 7/2002 |
| JP | 2003-17742 A | 1/2003 |
| JP | 2003-59948 A | 2/2003 |
| JP | 2003-249642 A | 9/2003 |

OTHER PUBLICATIONS

Zhi Zhen Ye et al., "An Ultraviolet Photodetector Based on GaN /Si", *International Journal of Modern Physics B*, vol. 16, Nos. 28 & 29, 2002, pp. 4310-4313.

H. Marchand et al., "Metalorganic Chemical Vapor Deposition of GaN on Si (111): Stress Control and Application to Field-Effect Transistors", *Journal of Applied Physics*, vol. 89, No. 12, Jun. 15, 2001, pp. 7846-7851.

Ching-Wu Wang et al., "Effect of Rapid Thermal Annealing on Radio-Frequency Magnetron-Sputtered GaN Thin Films and Au/GaN Schottky Diodes", *Journal of the Vacuum Science & Technology B*, vol. 17, No. 4, Jul./Aug. 1999, p. 1545-1548.

* cited by examiner

US 7,675,076 B2

NITRIDE-BASED SEMICONDUCTOR DEVICE OF REDUCED VOLTAGE DROP

CROSS REFERNCE TO RELATED APPLICATIONS

This is a continuation of Application PCT/JP2004/013819, filed Sep. 22, 2004, which claims priority to Japanese Patent Application No. 2003-331881 filed Sep. 24, 2003, and Japanese Patent Application No. 2004-093515 filed Mar. 26, 2004.

BACKGROUND OF THE INVENTION

This invention relates to semiconductor devices, and particularly to those of the class employing nitrides or derivatives thereof as semiconductors, as typified by light-emitting diodes (LEDs) and transistors.

Nitride-based semiconductor devices have been known and used extensively which are built upon substrates of sapphire, silicon, or silicon carbide. Of these known substrate materials, silicon offers the advantages of greater ease of machining and less expensiveness than the others. Additionally, unlike sapphire, silicon permits doping to provide a substrate that is sufficiently electroconductive to serve as part of the main current path in the device. Offsetting these advantages of the silicon substrate, as incorporated in semiconductor devices of prior art design, was a comparatively great voltage drop across the potential barrier between the substrate and the nitride semiconductor region thereon. As a result, in the case of LEDs for example, an unnecessarily high drive voltage was required for obtaining light of desired intensity.

Japanese Unexamined Patent Publication No. 2002-208729 teaches an LED explicitly designed to resolve the noted difficulties accompanying the silicon substrate. Successively grown by epitaxy on an n-type silicon substrate according to this prior art are an aluminum nitride (AlN) buffer layer, an n-type indium gallium nitride (InGaN) layer, an n-type gallium nitride (GaN) layer, an InGaN active layer, and a p-type GaN layer. In the course of the epitaxial growth of these layers, there are diffused into the silicon substrate both indium and gallium from the InGaN layer and aluminum from the AlN buffer layer. The result is the creation of a Ga—In—Al—Si alloy layer to a certain depth from the surface of the silicon substrate. Lowering the potential barrier of the heterojunction between the silicon substrate and the AlN buffer layer, the Ga—In—Al—Si alloy layer serves to reduce the drive voltage required by the LED for a current of given magnitude. Less power loss and higher efficiency are thus accomplished.

Despite the creation of the alloy layer as above, the potential barrier between the n-type silicon substrate and the overlying nitride semiconductor layer has still been not nearly so low as can be desired. The drive voltage required by the silicon-substrate LED with the alloy layer has been approximately 1.2 times as high as that of the more conventional sapphire-substrate LED for given output light intensity. The same problem has affected not just LEDs but transistors and other semiconductor devices in which current flows through the silicon substrate in its thickness direction.

Another problem with the LED concerns an electrode configuration on its light-emitting surface. The electrode must be so constructed and arranged on the light-emitting surface as to meet the dual, somewhat contradictory requirements of how to produce light of utmost intensity from the light-emitting surface and how to expedite electric connection of the electrode to wire or like conductor. A well known electrode configuration is to overlay the light-emitting surface with a transparent electrode, as of a mixture (hereinafter referred to as ITO) of indium oxide ($In_2O_3$) and stannic oxide ($SnO_2$) and to place an opaque wire-bonding pad centrally on the transparent electrode. The transparent electrode takes the form of a film of electroconductive material as thin as, say, 10 nanometers. The metal from which is made the bonding pad is easy to diffuse into the transparent electrode and, possibly, further into the underlying semiconductor region, with the consequent creation of a Schottky barrier between the bonding pad and the semiconductor region.

Capable of interrupting the forward current of the LED, the Schottky barrier reduces the amount of current flowing through that part of the semiconductor region which lies right under the bonding pad. The result is the flow of a correspondingly greater amount of current through the outer part of the semiconductor region which is out of register with the bonding pad. Thus the Schottky barrier functions just like the familiar current-blocking layer that has been used in LEDs for blocking current flow through the part of the active layer which immediately underlies the bonding pad. The current flowing under the bonding pad is a waste of energy, the light generated there being interrupted by the opaque bonding pad on the light-emitting surface of the LED. Just as the current-blocking layer contributes to enhancement of LED efficiency by causing a greater amount of current to flow through the outer part of the semiconductor region, so does the Schottky barrier.

The Schottky barrier has proved to possess its own drawback, however. As has been stated, the LED with an n-type silicon substrate has a comparatively high forward drive voltage. The higher forward drive voltage inevitably incurs greater power loss, and a greater amount of heat generated, at the silicon substrate and the semiconductor region. The Schottky barrier performs its intended function to a lesser extent when the device heats up to excessive temperatures than when it does not. As a consequence, in the prior art LED with the n-type silicon substrate, greater current leakage occurred through the Schottky barrier, resulting in turn in less current flow through the desired outer part of the semiconductor region.

The current-blocking layer is less temperature-dependent and so more reliable than the Schottky barrier for the purpose for which it is intended. However, the current-blocking layer is objectionable by reason of the additional manufacturing steps required for its own creation, in contrast to the Schottky barrier which demands no such steps, it being a byproduct, so to say, of the conventional transparent electrode and opaque bonding pad thereon.

SUMMARY OF THE INVENTION

The present invention seeks, in nitride-based semiconductor devices of the kind having a silicon substrate, to reduce the voltage drop to a minimum and so to make it possible for the devices to operate with a lower drive voltage than heretofore.

Briefly, the invention may be summarized as a nitride-based semiconductor device of reduced voltage drop which is suitable for use as a light-emitting diode or transistor, among other applications. Included is a substrate made from silicon of p-type conductivity, as distinguished from the conventional n-type silicon substrate. An n-type nitride semiconductor region is formed on one of the pair of opposite major surfaces of the p-type silicon substrate, and a main semiconductor region, which constitutes the primary working part of the semiconductor device, is formed on the n-type nitride semiconductor region. A first electrode is formed on the main semiconductor region, and a second electrode on the other of the pair of opposite major surfaces of the substrate.

The invention may be embodied in a variety of known types of semiconductor devices such as an LED, a transistor, and an insulated-gate field-effect transistor. The term "main semiconductor region" as used above and in the claims appended hereto should be understood to comprehend various constructions depending upon the semiconductor devices to be made. For example, the main semiconductor region may comprise an active layer and a p-type nitride cladding for providing an LED, a p-type base region and n-type emitter region for providing a transistor, and a p-type body region and n-type source region for providing an insulated-gate field-effect transistor.

The invention succeeds in a drastic curtailment of the drive voltages of the semiconductor devices of the kind in question without in any way impairing the crystallinity of the main semiconductor region. Despite the n-type conductivity of the overlying nitride semiconductor region, and contrary to the prior art, the silicon substrate is doped into p-type conductivity. The heterojunction thus created between the n-type nitride semiconductor region and the p-type silicon substrate has interface levels. If an additional layer is interposed between the n-type nitride semiconductor region and the p-type silicon substrate to provide the quantum-mechanical tunnel effect, as in some embodiments disclosed herein, then interface levels exist across the interposed layer. The interface levels are energy levels conducive to electric conduction between the n-type nitride semiconductor region and the p-type silicon substrate, expediting the transfer of carrier electrons from the substrate to the nitride semiconductor region. Consequently, a less potential barrier than heretofore is present at the interface between the substrate and the nitride semiconductor region, irrespective of the presence or absence of the additional layer therebetween. The reduction of the potential barrier leads to that of the drive voltage requirement of the semiconductor device and hence to that of power loss.

It will be appreciated that these achievements of the invention are accomplished merely by switching the silicon substrate from n- to p-type conductivity. No extra cost is needed for the manufacture of the improved semiconductor devices.

In some embodiments of the invention, which take the form of LEDs, the aforesaid first electrode is comprised of a transparent overlay formed on the main semiconductor region and a bonding pad placed centrally on the transparent overlay. As has been discussed in conjunction with the prior art, there is created between the bonding pad and the semiconductor region a Schottky baffier which functions to block the forward current of the LED. Should the LED be easy to overheat, as has been the case with the prior art devices of comparable design, the Schottky baffier would fail to perform its intended function to the full. Since the LED according to the invention operates with a less drive voltage, suffers less power loss, and generates less heat, than the prior art, the Schottky barrier will hardly deteriorate and keep the efficiency of light emission at a predetermined maximum throughout the expected lifetime of the LED.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
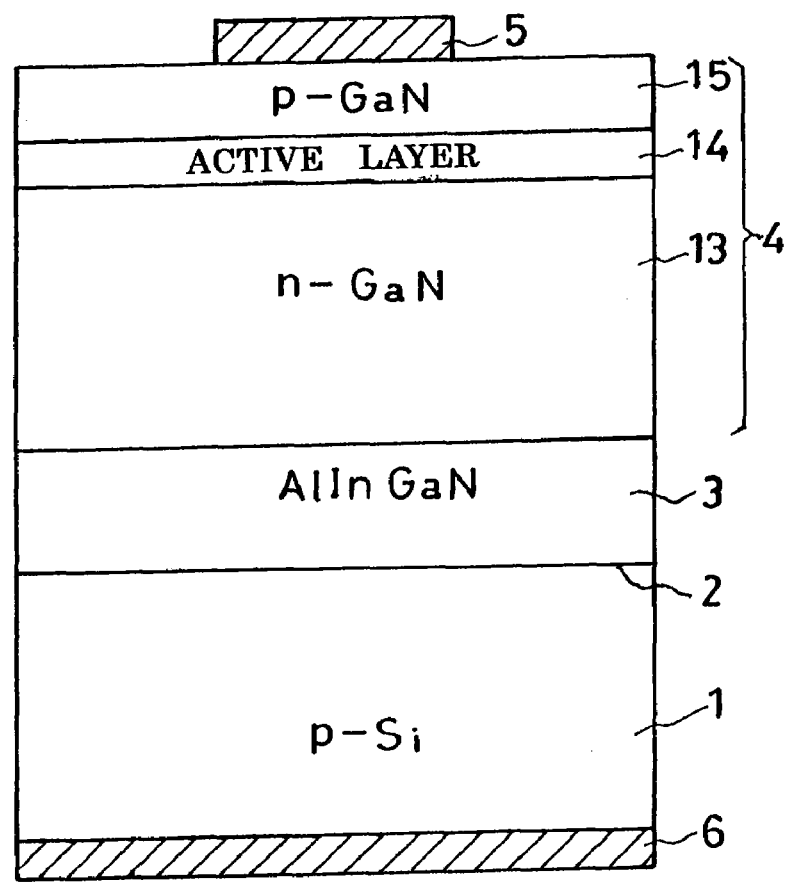
FIG. 1 is a schematic sectional illustration of an LED built upon the novel principles of the present invention.

The nitride-based semiconductor device embodying the present invention will now be described more specifically in terms of the LED shown in FIGS. 1-3 of the attached drawings. The exemplified LED broadly comprises:

1. A substrate 1 made from silicon doped into p-type conductivity according to a feature of this invention.
2. A buffer region 3 of an n-type nitride semiconductor overlying one of the pair of opposite major surfaces of the silicon substrate 1.
3. A main semiconductor region 4, which constitutes the primary working part of the LED, overlying the buffer region 3.
4. A first electrode or top electrode 5 placed centrally atop the main semiconductor region 4.
5. A second electrode or bottom electrode 6 on the underside of the silicon substrate 1.

The main semiconductor region 4 of the LED is shown comprised of an n-type nitride semiconductor layer 13, an active layer 14, and a p-type nitride semiconductor layer 15. These constituent layers 13-15 of the main semiconductor region 4 are successively grown by epitaxy on the buffer region 3.

The p-type silicon substrate 1 is opposite in conductivity type to the overlying n-type buffer region 3. The silicon substrate 1 has gained the p-type conductivity by being doped with p-type or acceptor impurity, such as those of boron or like Group III element, to a concentration ranging from $5 \times 10^{18}$ to $5 \times 10^{19}$ cm$^{-3}$. So doped, the silicon substrate 1 is electrically conductive, being as low in resistivity as from 0.0001 to 0.0100 ohm-centimeter, and provides part of the current path between the electrodes 5 and 6. The silicon substrate 1 must be sufficiently thick (e.g. 350 micrometers) and sturdy to serve as a mechanical support for the overlying parts 3-5 of the LED.

The n-type buffer region 3 on the p-type silicon substrate 1 is made from an n-type nitride semiconductor composed of one or more Group III elements and a Group V element of nitrogen. More specifically, the buffer region 3 is made from any of the nitrides of the following general formula plus an n-type impurity or donor:

$$Al_l In_b GA_{l-a-b} N$$

where the subscripts a and b are both numerals that are equal to or greater than zero and less than one, and the sum of a and b is less than one. Preferred nitrides for the buffer region 3, all encompassed by the general formula above, include aluminum indium gallium nitride (AlInGaN), gallium nitride (GaN), aluminum indium nitride (AlInN), and aluminum gallium nitride (AlGaN). Of these, AlInGaN is currently believed to be most desirable. Preferably, the subscript a in the formula above is from 0.1 to 0.7, and the subscript b from 0.0001 to 0.5000. The composition of the buffer region 3 is $Al_{0.5}In_{0.01}Ga_{0.49}N$ in this particular embodiment of the invention.

The buffer region 3 is intended primarily for causing the overlying main semiconductor region 4 to faithfully conform to the crystal orientation of the underlying silicon substrate 1. The buffer region 3 should be at least ten nanometers thick in order to perform the buffering function satisfactorily. However, the thickness should not exceed 500 nanometers to save the buffer region from cracking. The buffer region 3 is 30 nanometers thick in this particular embodiment.

There is a comparatively slight energy difference between the minimum level of the conduction band of nitride semiconductors and the maximum level of the valence band of silicon. A Type Two or Three heterojunction is therefore created at the interface 2 between p-type silicon substrate 1 and n-type nitride semiconductor buffer region 3. The Type Two heterojunction is a junction between two different semiconductors such that the maximum level of the valence band of one semiconductor lies intermediate the maximum level of the valence band and the minimum level of the conduction band, of the other semiconductor in the energy band diagram, and that the minimum level of the conduction band of the one semiconductor is higher than the minimum level of the conduction band of the other semiconductor. The Type Three heterojunction is such that the maximum level of the valence band of one semiconductor is higher than the minimum level of the conduction band of the other.

Let us suppose that the heterojunction between p-type silicon substrate 1 and n-type buffer region 3 is of Type Two. The energy band configuration of this heterojunction in thermal equilibrium is as diagramed in FIG. 3A if the silicon substrate is of n-type conductivity according to the prior art, and in FIG. 3B if the silicon substrate is of p-type conductivity according to the instant invention. In both FIGS. 3A and 3B the indicia $E_v$, denote the maximum level of the valence band, $E_c$ the minimum level of the conduction band, and $E_f$ the Fermi level. The indicia $E_t$ at the inhibit band in FIG. 3B designate the interface levels of the heterojunction between p-type silicon substrate 1 and n-type buffer region 3.

Figure 3B:
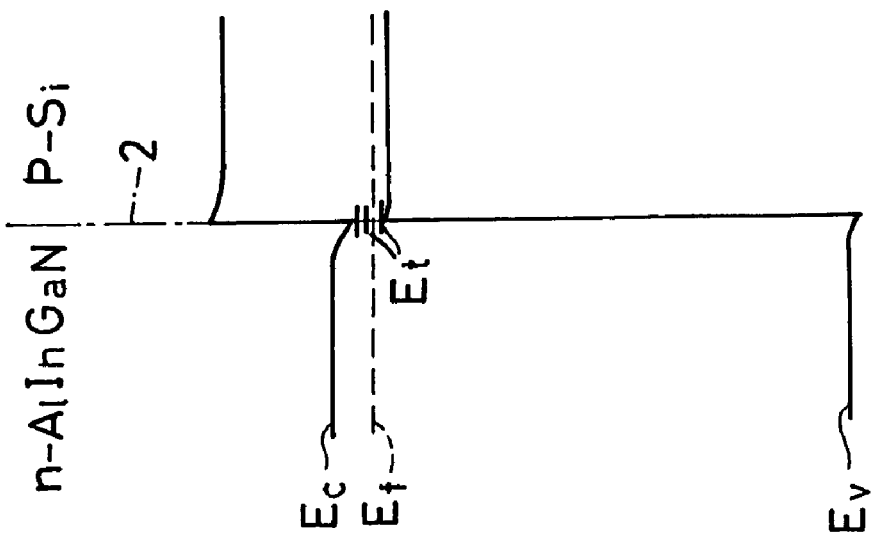
FIG. 3B is an energy band diagram of the heterojunction between p-type silicon substrate and n-type nitride semiconductor buffer region grown thereon in the LED of FIG. 1.

When the Type Two heterojunction is created as in FIG. 3B, many interface levels exist at the interface 2 of the heterojunction, permitting the transfer therethrough of carriers (electrons) from the valence band of the p-type silicon substrate 1 to the conduction band of the n-type semiconductor buffer region 3. The result is a less potential barrier at the heterojunction between substrate 1 and buffer region 3 and, therefore, a less drive voltage requirement of the LED for output light of given intensity.

Possibly, the heterojunction created between p-type silicon substrate 1 and n-type semiconductor buffer region 3 may be of Type Three. In that case carriers will be introduced directly from the valence band of the p-type silicon substrate 1 into the conduction band of the n-type semiconductor buffer region 3. The heterojunction will then offer a drastically less potential barrier, making it possible to drive the LED with a correspondingly less voltage than heretofore.

With reference back to FIG. 1 the main semiconductor region 4 is configured to generate light to be emitted. In this particular embodiment, for providing a double heterojunction LED, itself well known in the art, the main semiconductor region 4 comprises as aforesaid the n-type nitride semiconductor layer 13, active layer 14, and p-type nitride semiconductor layer 15, grown successively in that order on the buffer region 3. The n-type semiconductor layer 13 would be unnecessary if the n-type nitride buffer region 3 could serve the purpose of the layer 13. It is also possible to omit the active layer 14 and to place the remaining layers 13 and 15 in direct contact with each other.

The n-type nitride semiconductor layer 13 of the main semiconductor region 4 is made from any of the nitrides that are expressed by the following general formula, plus an n-type dopant:

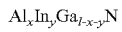

$$Al_xIn_yGa_{1-x-y}N$$

where the subscripts x and y are both numerals that are equal to or greater than zero and less than one. The semiconductor layer 13 is made from n-type GaN (x=0, y=0) to a thickness of about two micrometers in this particular embodiment. Known also as a cladding for the active layer 14, the semiconductor layer 13 has a greater bandgap than the active layer.

The active layer 14 of the main semiconductor region 4 has a composition that is also defined by the formula:

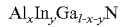

$$Al_xIn_yGa_{1-x-y}N$$

where the subscripts x and y are both numerals that are equal to or greater than zero and less than one. The active layer 14 is made from InGaN (x=0, y >0). The active layer 14 may be either a single layer as shown or of the known multiple quantum well structure. Also, the active layer 14 may be either undoped with a conductivity type determinant as in the present embodiment or doped with a p- or n-type determinant.

The p-type nitride semiconductor layer 15 of the main semiconductor region 4 is made from any of the nitrides that are also expressed by the following general formula, plus a p-type dopant:

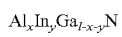

$$Al_xIn_yGa_{1-x-y}N$$

where the subscripts x and y are both numerals that are equal to or greater than zero and less than one. The semiconductor layer 15 is made from p-type GaN to a thickness of about 500 nanometers in this particular embodiment. Known also as another cladding for the active layer 14, the semiconductor layer 15 has a greater bandgap than the active layer.

Grown on the silicon substrate 1 via the buffer region 3, the above constituent layers 13-15 of the main semiconductor region 4 are all favorable in crystallinity. The anode 5 is positioned centrally on the surface of the p-type nitride semiconductor layer 15 of the main semiconductor region 4 and electrically connected thereto. A contact layer of a p-type nitride semiconductor could be inserted between the anode 5 and the p-type nitride semiconductor layer 15. The cathode 6 is bonded to the underside of the p-type silicon substrate 1.

For fabricating the LED of FIG. 1 there may be first prepared the p-type silicon substrate 1 having a major surface of (111) in terms of Miller indices. This substrate may be put to known final hydrogen treatment using a hydrofluoric acid etchant.

Then the substrate may be placed in an organometallic vapor phase epitaxy (OMVPE) reactor and therein heated to 1170° C. The substrate may be held at that temperature for ten minutes by way of thermal cleaning for removal of oxide films from its surfaces. Then, with the reactor temperature held in a prescribed range (e.g. from 1000 to 1100°C.) above 1000° C., the buffer region 3 may be epitaxially grown on the substrate 1 by OMVPE. If the desired buffer region 3 is of n-type AlInGaN, there may be introduced into the OMVPE reactor the gases of trimethylaluminum (TMAl), trimethylindium (TMIn), trimethylgallium (TMGa), ammonia ($NH_3$), and silane ($SiH_4$). The silicon contained in $SiH_4$ serves the purpose of an n-type impurity.

Then, on the buffer region 3 fabricated as above, there may be successively grown in the same reactor the n-type nitride semiconductor layer 13, active layer 14, and p-type nitride semiconductor layer 15 of the main semiconductor region 4. More specifically, for creating the semiconductor layer 13 of n-type GaN, the substrate 1 may be heated to 1000-1000° C., and prescribed proportions of TMGa, $SiH_4$ and $NH_3$ may be charged into the reactor, until the n-type GaN semiconductor layer 13 grows to a thickness of two micrometers. This semiconductor layer 13 may be about $3 \times 10^{18}$ cm$^{-3}$ in n-type impurity concentration, which is lower than that of the silicon substrate 1. Just as the buffer region 3 which has been preformed on the substrate 1 will have faithfully conformed to the crystallinity of the substrate 1, so will the semiconductor layer 13 of the main semiconductor region 4.

The next step is the creation of the active layer 14 on the n-type nitride semiconductor layer 13. Preferably, as aforesaid, the active layer 14 is of multiple quantum well configuration, having a plurality of, four for instance, alternations of barrier and well sublayers. First, for fabricating the lowermost barrier sublayer, the substrate temperature may be allowed to drop to 800° C. after terminating the introduction of the gases used for growing the n-type GaN layer 13. Then the prescribed proportions of TMGa, TMIn and $NH_3$ may be charged into the reactor for creating the lowermost barrier sublayer of $In_{0.02}Ga_{0.98}N$ to a thickness of 13 nanometers. Then one well sublayer of $In_{0.02}Ga_{0.8}N$ may be formed to a thickness of three nanometers on the lowermost barrier sublayer in a like manner, only with the proportion of TMIn altered. The creation of one barrier sublayer and one well sublayer may be repeated three more times to complete the multiple quantum well active layer 14. The thus-formed multi-sublayered active layer 14 will be of good crystallinity, succeeding that of the underlying n-type nitride semiconductor layer 13. The active layer 14 might be doped with a p-type impurity.

Then, with the substrate temperature raised to 1000-1110° C. again, the prescribed proportions of TMGa, $NH_3$, and biscyclopentadienylmagnesium (Cp2Mg) may be charged into the reactor thereby creating the p-type GaN semiconductor layer 15 to a thickness of about 500 nanometers on the active layer 14. Introduced to a density of $3 \times 10^{18}$ cm$^{-3}$, the magnesium serves as the p-type impurity.

Then comes the fabrication of the top electrode 5 and bottom electrode by vacuum deposition. The LED has now been completed.

Figure 2:
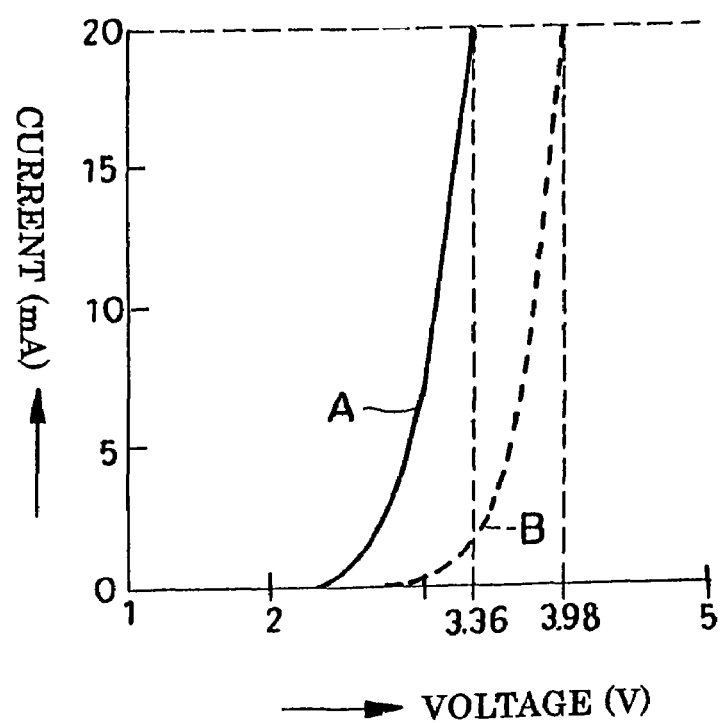
FIG. 2 is a graph plotting the curves of the voltage-current relationships of the LED according to the invention and of the prior art device having the n-type silicon substrate.

The curve A in the graph of FIG. 2 represents the magnitude of the current flowing through the LED fabricated as above, upon application of a forward voltage (top electrode 5 positive, bottom electrode 6 negative). The curve B in the same graph represents the same voltage-current characteristic of the prior art LED having the n-type silicon substrate as in the unexamined Japanese patent application cited earlier herein. The graph indicates that the invention requires a drive voltage of 3.36 volts for current flow of 20 milliamperes whereas the prior art requires that of 3.98 volts for the same current flow. The invention succeeds in dropping the drive voltage by 0.62 volt for 20-milliampere current flow merely by switching the conductivity type of the substrate 1 from n to p type.

Figure 3A:
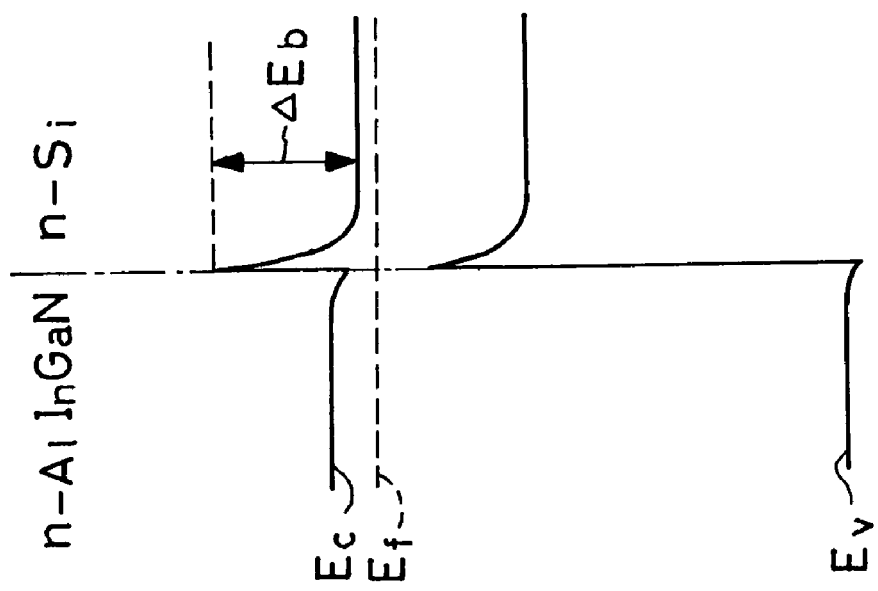
FIG. 3A is an energy band diagram of the heterojunction between n-type silicon substrate and n-type nitride semiconductor layer grown thereon in the noted prior art LED.

The advantages gained by the present invention will be best understood by re-examining the energy band diagrams of FIGS. 3A and 3B. The prior art heterojunction of FIG. 3A is formed by the n-type silicon substrate (n-Si) and the n-type nitride semiconductor buffer region (n-AlInGaN) grown thereon. This prior art heterojunction demands a relatively high drive voltage because of the relatively great potential barrier $\Delta E_b$.

By contrast, as is apparent from FIG. 3B, the heterojunction between p-type silicon substrate p-Si) and n-type nitride semiconductor buffer region (n-AlInGaN) according to the invention presents a much lower potential barrier. Moreover, the heterojunction interface 2 has many interface levels $E_t$. Lying between the maximum level of the valence band of the p-type silicon substrate 1 and the minimum level of the conduction band of the n-type buffer region 3, the interface levels $E_t$ serve for enhancement of the generation and recombination of electrons and holes at the heterojunction interface 2 as well as in the neighborhood thereof.

As will be understood by referring back to FIG. 1, the right-hand side of the interface line 2 in FIG. 3B represents the p-type silicon substrate 1, and the left-hand side the n-type buffer region 3. The carriers are easy to travel from substrate 1 into buffer region 3 via the interface levels $E_t$, with a consequent drop in the potential barrier at the heterojunction between substrate 1 and buffer region 3. Hence the drastic curtailment of the forward drive voltage requirement of the LED according to the invention.

It may be appreciated that the drastic lessening of the drive voltage is accomplished without in any way sacrificing the crystallinity of the main semiconductor region 4. The lower the drive voltage requirement of an LED, the less is its power loss. Also noteworthy is the fact that the reduction of the drive voltage is accomplished merely by altering the conductivity type of the silicon substrate from n to p, in other words, without adding to the manufacturing costs of LEDs.

EMBODIMENT OF FIG. 4

Figure 4:
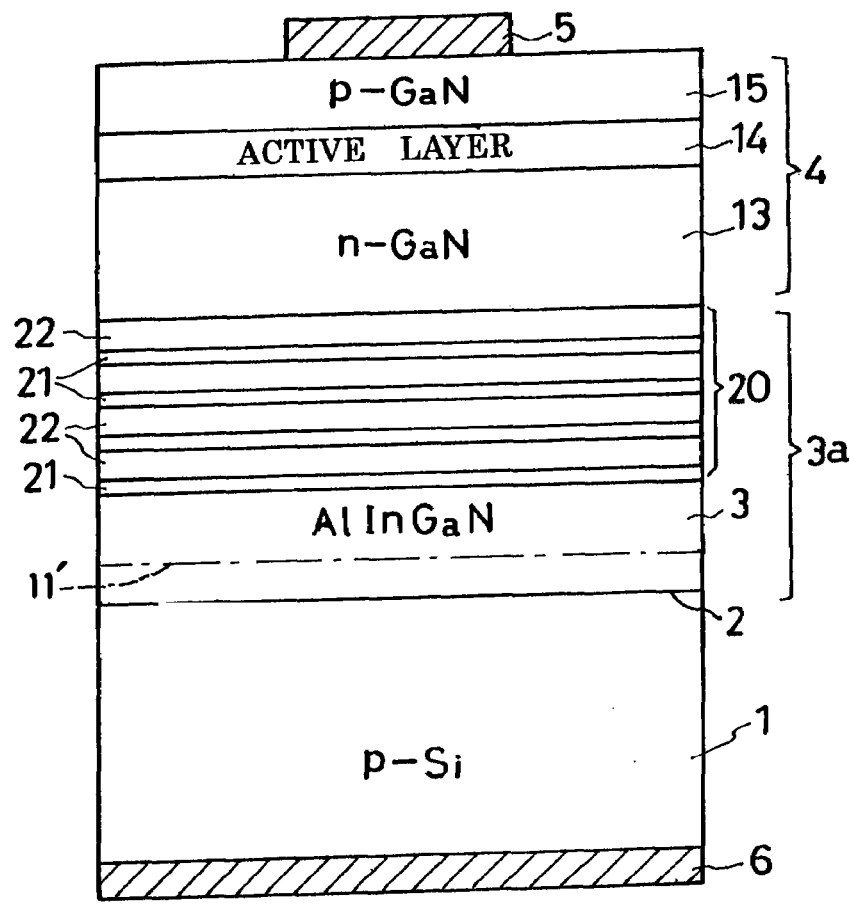
FIG. 4 is a view similar to FIG. 1 but showing another preferred form of LED according to the invention.

In FIG. 4 is shown another preferred form of LED according to the present invention. This alternate LED features a modified buffer region $3_a$, all the other details of construction being as previously set forth with reference to FIG. 1.

The modified buffer region $3_a$ is a lamination of a first or monolayered buffer subregion 3 of n-type AlInGaN, similar to the buffer region 3 of the FIG. 1 embodiment, and, thereover, a second or multilayered buffer subregion 20. The multilayered buffer subregion 20 is a lamination of alternating two different kinds of layers 21 and 22. The first layers 21 of the second buffer subregion 20 contain aluminum whereas the second layers 22 thereof either do not contain aluminum or do contain it in a less proportion than do the first layers 21.

More specifically, the first layers 21 of the second buffer subregion 20 are made from any of the nitride semiconductors that can be defined by the following general formula, in addition to an n-type dopant:

$Al_xM_yGa_{1-x-y}N$ where M is at least either of indium and boron; the subscript x is a numeral that is greater than zero and equal to or less than one; the subscript y is a numeral that is equal to or greater than zero and less than one; and the sum of x and y is equal to or less than one.

Each first layer 21 of the second buffer subregion 20 should be sufficiently thick (e.g. one to ten nanometers) to provide the quantum mechanical tunnel effect. In this particular embodiment the first layers 21 are made from aluminum nitride (AIN) plus silicon as an n-type dopant, although an undoped nitride semiconductor could be employed.

The second layers 22 of the second buffer subregion 20 are made from any of the nitride semiconductors that can be defined by the following general formula, aside from an n-type dopant:

$$Al_aM_bGa_{1-a-b}N$$

where M is at least either of indium and boron; the subscript a is a numeral that is equal to or greater than zero, less than one, and less than x in the formula above defining the composition of the first layers 21 of the second buffer subregion 20; the subscript b is a numeral that is equal to or greater than zero and equal to or less than one; and the sum of a and b is equal to or less than one.

A doping of the second layers 22 of the second buffer subregion 20 with silicon is preferred. It is also preferred that the second layers 22 have a composition identical with, or similar to, that of the monolayered first buffer subregion 3. The second layers 22 are made from n-type GaN in this particular embodiment. The second layers 22 should be not less than 10 nanometers thick, thicker than the first layers 21 and too thick to provide the quantum mechanical tunnel effect. No serious problems will occur, however, if the second layers 22 are of the same thickness as the first layers 21 and provides the quantum mechanical tunnel effect.

For fabricating the multilayered second subregion 20 of the modified buffer region $3_a$, there may be introduced into the reactor, following the fabrication of the monolayered first subregion 3, TMAl at a rate of 50 micromoles per minute, $SiH_4$ at 20 nanomoles per minute, and $NH_3$ at 0.14 mole per minute, thereby growing the lowermost first layer 21 of n-type AlN to a thickness of five nanometers. Then the introduction of TMAl may be discontinued, that of $SiH_4$ and $NH_3$ continued, and TMGa may be additionally introduced at 50 micromoles per minute, thereby growing the lowermost second layer 22 of n-type GaN to a thickness of 25 nanometers. Then, despite the showing of FIG. 4, one first layer 21 and one second layer 22 may be alternately fabricated in a like manner until the multilayered second buffer subregion 20 is created which consists of a total of forty such layers.

The multilayered buffer subregion 20 serves to improve the flatness of the top surface of the buffer region $3_a$. As a modification of the buffer region configuration depicted in FIG. 4, the monolayered first buffer subregion 3 may be omitted, and the multilayered buffer subregion 20 placed directly on the p-type silicon substrate 1. In other words, the monolayered buffer region 3 of FIG. 1, as well as those in FIGS. 6-9, is replaceable by a multilayered buffer region similar to the buffer subregion 20. The buffer subregion 20 may have both first and second layers 21 and 22 thereof doped with an n-type impurity when. grown directly upon the substrate 1.

EMBODIMENT OF FIG. 5

Figure 5:
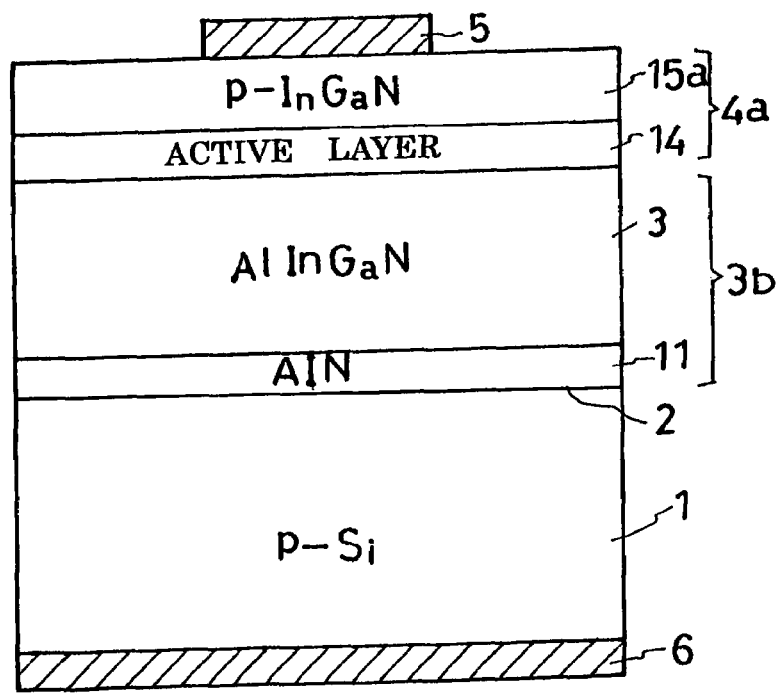
FIG. 5 is also a view similar to FIG. 1 but showing still another preferred form of LED according to the invention.

A still another preferred form of LED shown in FIG. 5 features what may be termed an additional layer or intervention layer 11 of an aluminum-containing nitride interposed between the p-type silicon substrate 1 and the n-type nitride buffer subregion 3. Further the buffer subregion 3 doubles as a bottom cladding of the active layer 14, there being in this embodiment no equivalent of the n-type GaN layer 13 of the FIGS. 1 and 4 embodiments. In FIG. 5 the n-type buffer subregion 3 and additional layer 11 are collectively indicated as a modified buffer region $3_b$, and the active layer 14 and an overlaying p-type nitride layer $15_a$ collectively indicated as a modified main semiconductor region $4_a$. The other details of construction are as previously set forth with reference to FIG. 1.

The additional layer 11 is made from any of the nitrides that are generally defined as:

$$Al_xIn_yGa_{1-x-y}N$$

where the subscripts x is a numeral that is greater than zero and equal to or less than one; the subscript y is a numeral that is equal to or greater than zero and less than one; and the s um of x and y is greater than zero and equal to or less than one. The additional layer 11 is indi6ated as being made from AlN in FIG. 5 (x=1, y =0). The additional layer 11 could be doped with an n-type impurity.

The additional layer 11 is higher in resistivity than the n-type buffer subregion 3, and its thickness is from one to 60 nanometers, preferably from one to ten nanometers to provide the quantum mechanical tunnel effect, and most desirably from two to three nanometers. If the additional layer 11 is just thick enough to provide the quantum mechanical tunnel effect, its presence is virtually negligible in regard to conductivity between p-type silicon substrate 1 and n-type buffer subregion 3. Carriers (electrons) will therefore smoothly travel from p-type silicon substrate 1 to n-type nitride buffer subregion 2 via the interface levels $E_i$, FIG. 3B, of the heterojunction between p-type silicon substrate 1 and n-type buffer region 3. Thus, as in the FIG. 1 embodiment, the potential barrier will be reduced between p-type silicon substrate 1 and n-type buffer region 3, with a corresponding diminution of the drive voltage requirement of the LED.

Preferably, the additional layer 11 should be of such composition that the difference in lattice constant between it and the p-type silicon substrate 1 is less than that between substrate 1 and n-type buffer subregion 3 or main semiconductor region 4, $4_a$-$4_c$. It is also recommended that the additional layer 11 be so made that the difference in thermal expansion coefficient between it and the substrate 1 is less than that between substrate 1 and n-type buffer subregion 3 or main semiconductor region 4, $4_a$-$4_c$.

EMBODIMENT OF FIG. 6

Figure 6:
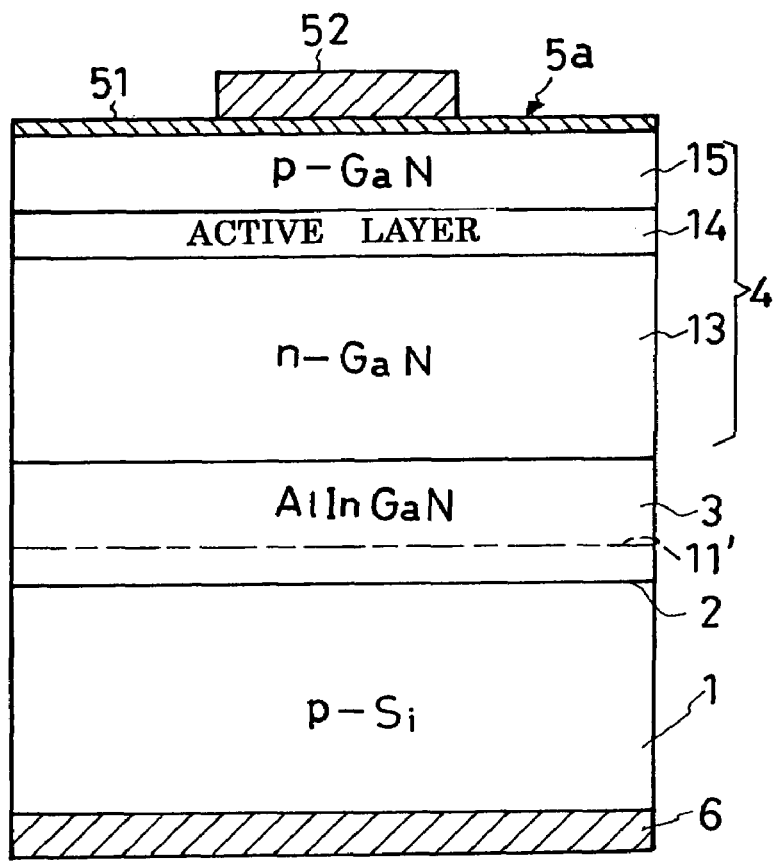
FIG. 6 is also a view similar to FIG. 1 but showing a further preferred form of LED according to the invention.

The LED shown in FIG. 6 is similar in construction to that of FIG. 1 except for a modified top electrode $5_a$. The modified top electrode $5_a$ is a familiar combination of a transparent, electroconductive overlay 51 and a wire-bonding pad 52. Covering the complete surface of the p-type nitride semiconductor layer 15 of the main semiconductor region 4, the overlay 51 is typically made from ITO. The bonding pad 52 is disposed centrally on the overlay 51.

The overlay 51 of the top electrode $5_a$ is approximately 10 nanometers thick and makes resistive contact with the p-type nitride semiconductor layer 15. The bonding pad 52 is made from a metal such as nickel, gold or aluminum to a sufficient thickness to permit wire bonding. Being much thicker than the overlay 51, the bonding pad 52 is practically impervious to the light generated by the LED. It is understood that, either during or after the fabrication of the bonding pad 52, the metal from which is made the bonding pad diffuses into the overlay 51 and, possibly, into part of the main semiconductor region 4, with a consequent creation of a Schottky barrier between bonding pad and main semiconductor region.

Current flows from overlay 51 into main semiconductor region 4 during the application of a forward voltage between the top electrode $5_a$ and bottom electrode 6 (top electrode $5_a$ higher in potential than the bottom electrode 6). Little or no current, however, will flow from the bonding pad 52 into the immediately underlying part of the main semiconductor region 4 by reason of the Schottky barrier that has been created as above between bonding pad and main semiconductor region. The current will therefore mostly flow through the overlay 51 into the outer part (i.e. the part other than that part of the main semiconductor region which lies right under the bonding pad) of the main semiconductor region 4. The light generated by such controlled current flow is emitted through the transparent overlay 51 without being hindered by the opaque bonding pad 52.

As has been stated, the Schottky barrier diminishes in effectiveness with a rise in ambient temperature, permitting a progressively greater amount of current to flow therethrough. The heating of the LED should therefore be avoided in order to maintain its efficiency at a maximum. Incorporating the p-type silicon substrate 1 proposed by the instant invention, the LED of FIG. 6 suffers far less heating and power loss than the prior art devices employing n-type silicon substrates. The Schottky barrier between bonding pad 52 and main semiconductor region 4 is thus kept from thermal deterioration and so acts more effectively than heretofore to prevent current flow therethrough.

Consequently, for a given amount of current between the electrodes $5_a$ and 6, a greater proportion of it than heretofore flows through the outer part of the main semiconductor region 4 rather than through its part immediately underlying the bonding pad 52. This means a correspondingly higher efficiency of the LED than that of the prior art having the n-type silicon substrate. Conversely, if the FIG. 6 LED is to be allowed to generate the same amount of heat as does the prior art, a greater amount of current will be allowed to flow for emission of a correspondingly greater intensity of light.

It is self-evident that by incorporating the p-type silicon substrate 1, the FIG. 6 embodiment gains the same additional advantages as those indicated in conjunction with that of FIG. 1. The electrode configuration of FIG. 6 is applicable to the FIGS. 4 and 5 embodiments as well.

EMBODIMENT OF FIG. 7

Figure 7:
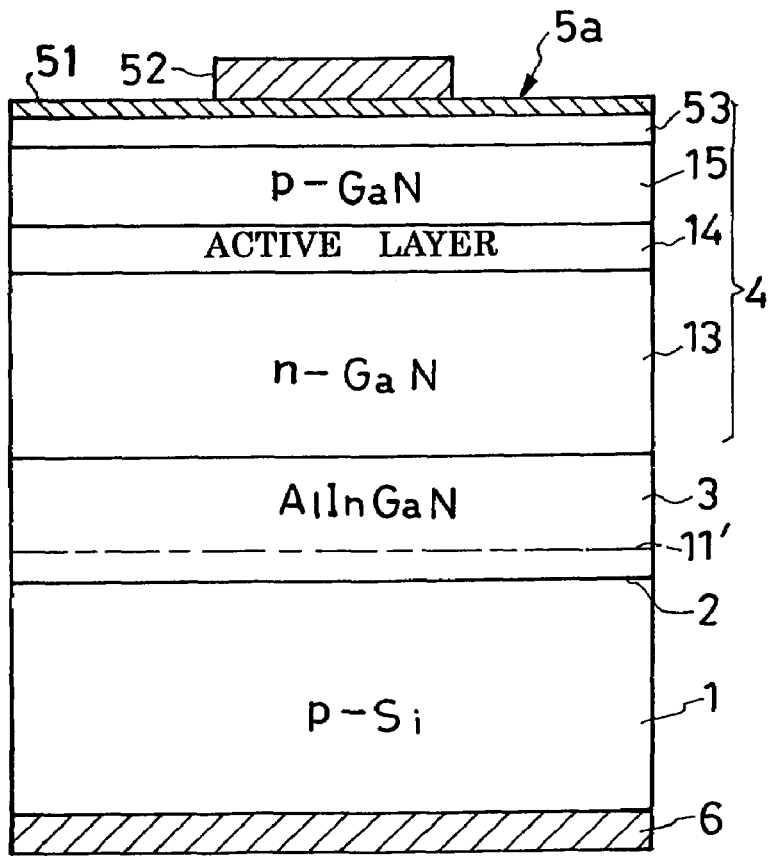
FIG. 7 is also a view similar to FIG. 1 but showing a still further preferred form of LED according to the invention.

FIG. 7 shows a further preferred form of LED according to the invention, which features an additional n-type nitride semiconductor layer 53 interposed between the top electrode $5_a$ of the same design as that of FIG. 6 and the main semiconductor region 4 similar to that of FIG. 1. All the other details of construction are analogous with those described in reference to FIG. 6.

The additional n-type nitride semiconductor layer 53 is made from any of the nitrides defined by the following general formula, plus an n-type dopant:

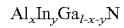

where the subscripts x and y are both numerals that are equal to or greater than zero and less than one. The semiconductor layer 53 is made from n-type GaN (x=0, y=0) in this particular embodiment.

If the transparent overlay 51 of the top electrode $5_a$ is of ITO, which acts like an n-type semiconductor, this layer makes ohmic contact of extremely low resistivity with the underlying additional n-type nitride semiconductor layer 53. The result is a reduction of power loss across the junction between transparent overlay 51 and additional nitride semiconductor layer 53, and hence of the forward drive voltage requirement of the LED for light production of given intensity.

Attention must be paid so the pn junction between the additional n-type nitride semiconductor layer 53 and the underlying p-type nitride semiconductor layer 15 may not hamper the flow of the forward current. This objective will be met in most cases by making the additional semiconductor layer 53 from one to 30, preferably from five to 10, nanometers thick. It is also desired that the additional semiconductor layer 53 be so thick as to provide the quantum mechanical tunnel effect.

Upon application of a forward voltage between the electrodes $5_a$ and 6 a current will flow from the transparent overlay 51 of the top electrode into the p-type nitride semiconductor layer 15 via the additional n-type nitride semiconductor layer 53. This LED suffers a less forward voltage drop from overlay 51 to nitride semiconductor layer 15, thanks to the interposition of the additional layer 53 therebetween, than does the LED of FIG. 6. Hence a less forward drive voltage requirement and an enhanced efficiency.

The teachings of FIG. 7 are applicable to the embodiments of FIGS. 4 and 5 as well.

EMBODIMENT OF FIG. 8

Figure 8:
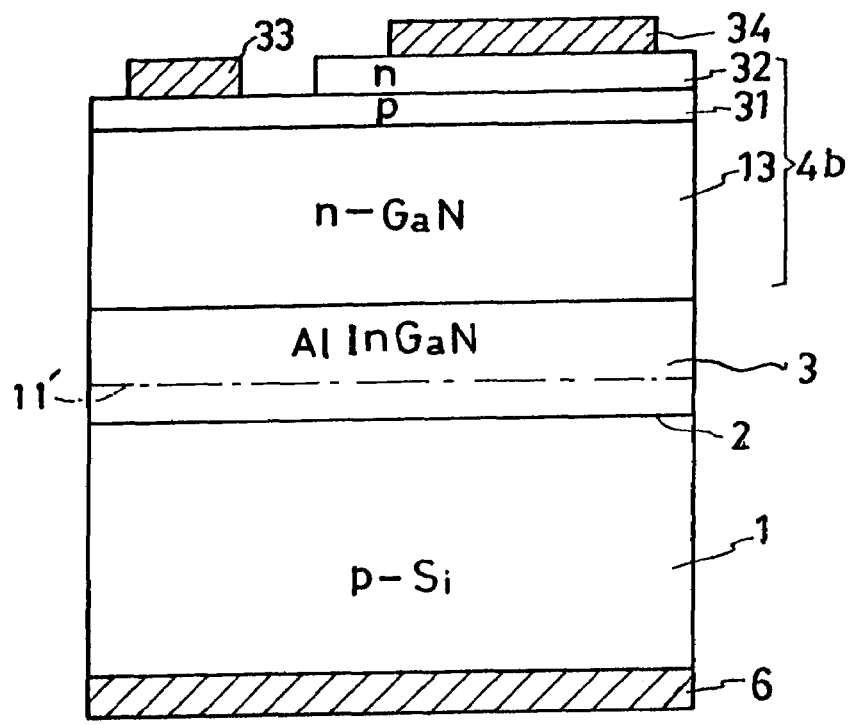
FIG. 8 is a schematic sectional illustration of a transistor embodying the principles of this invention.

FIG. 8 represents an adaptation of this invention for a transistor. The illustrated transistor differs from the FIG. 1 LED only in the design of its main semiconductor region $4_b$ and associated electrodes 33 and 34. The modified main semiconductor region $4_b$ comprises a collector subregion 13 of an n-type nitride semiconductor directly overlying the buffer region 3, a base subregion 31 of a p-type nitride semiconductor grown epitaxially on the collector subregion, and an emitter subregion 32 of an n-type nitride semiconductor grown epitaxially on part of the surface of the base subregion. The base electrode 33 is formed on the rest of the surface of the base subregion 31, and the emitter electrode 34 on the emitter subregion 32. The bottom electrode 6 on the underside of the p-type silicon substrate 6 serves as the collector electrode of the transistor.

Of the familiar npn type, the transistor of FIG. 8 is to be turned on by making the collector electrode 6 the highest in potential, causing current flow from the collector electrode to the emitter electrode 34. The voltage drop between the electrodes 6 and 34 when the transistor is turned on is reduced for the same reasons as explained above in connection with the FIG. 1 LED.

EMBODIMENT OF FIG. 9

Figure 9:
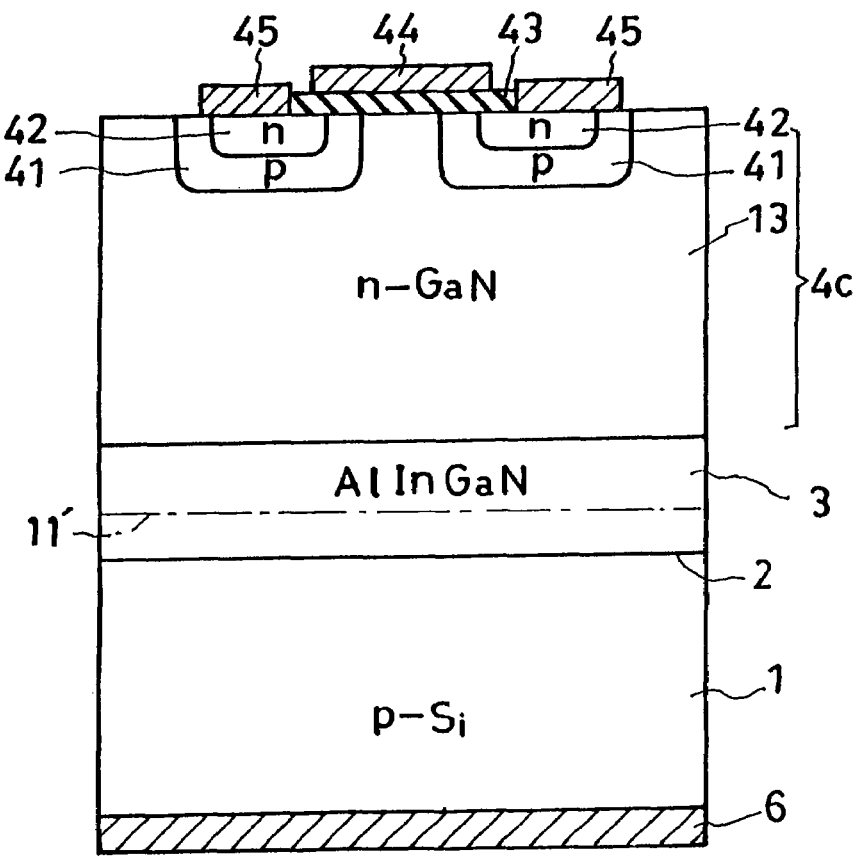
FIG. 9 is a schematic sectional illustration of a field-effect transistor embodying the principles of this invention.

In FIG. 9 is shown the present invention as adapted for an insulated-gate field-effect transistor (IGFET), which differs from the FIG. 1 LED only in the configuration of its main senuconductor region $4_c$ and associated electrodes. The modified main semiconductor region $4_c$ of the IGFET includes a drain subregion 13 of the same n-type nitride semiconductor as that of the semiconductor region designated by the same reference numeral in FIG. 1. A body subregion 41 is formed by introducing a p-type impurity into part of the drain subregion 13, and a source subregion 42 is formed by introducing an n-type impurity into part of the body subregion 41. A gate electrode 44 is formed via an insulator 43 on the body subregion 41 between drain subregion 13 and source subregion 42. A source electrode 45 is formed on the source subregion 42. The bottom electrode 6 on the underside of the p-type silicon substrate 1 serves as the drain electrode of the IGFET.

In this IGFET, too, the voltage drop between source electrode 45 and drain electrode 6 when it is turned on is reduced for the same reasons as explained above in connection with the FIG. 1 LED.

Possible Modifications

Notwithstanding the foregoing detailed disclosure it is not desired that the present invention be limited by the exact showings of the drawings or the description thereof. The following is a brief list of possible modifications, alterations or adaptations of the illustrated semiconductor devices which are all believed to fall within the purview of the claims annexed hereto:

1. The buffer region $3_a$ of the FIG. 4 LED or the buffer region $3_b$ of the FIG. 5 LED is substitutable for the buffer region 3 of the FIGS. 6 or 7 LED, FIG. 8 transistor, or FIG. 9 IGFET.

2. The buffer region 3 of the FIG. 8 transistor could additionally serve as part of the collector region, and that of the FIG. 9 IGFET could likewise serve as part of the drain region.

3. The AlN additional layer 11 of the FIG. 5 LED could be interposed between p-type silicon substrate 1 and buffer region 3 in the FIGS. 4 and 6-9 embodiments as well. The dot-and-dash line designated 11' in these figures indicates the phantom boundary of the transition layer that might be incorporated in such embodiments.

4. The illustrated buffer regions 3, $3_a$ and $3_b$ of various configurations may additionally incorporate a layer or layers of a different composition or compositions.

5. The buffer regions 3, $3_a$ and $3_b$ need not necessarily contain indium.

6. The present invention is applicable to rectifier diodes having a pn junction, to Schottky barrier diodes, and indeed to all the semiconductor devices in which current flows through the substrate in its thickness direction.

What is claimed is:

1. A light-emitting diode comprising:
   (a) a substrate made from silicon of p-type conductivity, the substrate having a pair of opposite major surfaces;
   (b) an n-type nitride semiconductor region formed on one of the major surfaces of the substrate;
   (c) a main semiconductor region formed on the n-type nitride semiconductor region, the main semiconductor region comprising an active layer and a p-type nitride semiconductor layer formed thereon;
   (d) an anode electrode electrically connected to the p-type nitride semiconductor layer of the main semiconductor region; and
   (e) a cathode electrode formed on the other of the pair of opposite major surfaces of the substrate,
   wherein the n-type nitride semiconductor region makes such contact with the substrate as to provide a current path from the n-type nitride semiconductor region to the substrate.

2. A light-emitting diode as defined in claim 1, wherein the n-type nitride semiconductor region is made from any of nitrides of the following general formula plus an n-type impurity:

$$Al_aIn_bGa_{1-a-b}N$$

where the subscripts a and b are both numerals that are equal to or greater than zero and less than one, and the sum of a and b is less than one.

3. A light-emitting diode as defined in claim 1, further comprising an additional layer interposed between the substrate and the n-type nitride semiconductor region, the additional layer being sufficiently thick to provide a quantum-mechanical tunnel effect and being higher in resistivity than the n-type nitride semiconductor region.

4. A light-emitting diode as defined in claim 3, wherein the additional layer is of an aluminum-containing nitride semiconductor.

5. A light-emitting diode as defined in claim 4, wherein the n-type nitride semiconductor region is made from any of nitrides of the following general formula plus an n-type impurity:

$$Al_aIn_bGa_{1-a-b}N$$

where the subscripts a and b are both numerals that are equal to or greater than zero and less than one, and the sum of a and b is less than one, and wherein the additional layer is made from any of aluminum-containing nitrides of the following general formula:

$$Al_xIn_yGa_{1-x-y}N$$

where the subscript x is a numeral that is greater than zero, equal to or less than one, and greater than a in the general formula above defining the composition of the n-type nitride semiconductor region; the subscript y is a numeral that is equal to or greater than zero and less than one; and the sum of x and y is greater than zero and equal to or less than one.

6. A light-emitting diode as defined in claim 1, further comprising a multilayered buffer region interposed between the n-type nitride semiconductor region and the main semiconductor region, the multilayered buffer region comprising a prescribed number of alternations of a first and a second layer, the first layers of the multilayered buffer region being of a nitride semiconductor containing aluminum in a first prescribed proportion that is greater than zero, the second layers of the multilayered buffer region being of a nitride semiconductor containing aluminum in a second prescribed proportion that is equal to or greater than zero and less than the first prescribed proportion.

7. A light-emitting diode as defined in claim 1, wherein the n-type nitride semiconductor region comprises a prescribed number of alternations of a first and a second layer, the first layers of the n-type nitride semiconductor region being of a nitride semiconductor containing aluminum in a first prescribed proportion that is greater than zero, the second layers of the n-type nitride semiconductor region being of a nitride semiconductor containing aluminum in a second prescribed proportion that is equal to or greater than zero and less than the first prescribed proportion.

8. A nitride-based semiconductor device comprising:
   (a) a substrate made from silicon of p-type conductivity, the substrate having a pair of opposite major surfaces:
   (b) an n-type nitride semiconductor region formed on one of the major surfaces of the substrate;
   (c) a multilayered buffer region formed on the n-type nitride semiconductor region, the multilayered buffer region comprising a prescribed number of alternations of a first layer and a second layer, wherein the first layers are each thick enough to provide a quantum mechanical tunnel effect and made from any of nitrides that are generally defined by the formula:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one; and wherein the second layers are made from any of nitrides that are generally defined by the formula:

$$Al_aM_bGa_{1-a-b}N$$

where M is at least either of indium and boron; the subscript a is a numeral that is equal to or greater than zero, less than one, and less than x in the formula above generally defining the composition of the first layers; the subscript b is a numeral that is equal to or greater than zero and equal to or less than one; and the sum of a and b is equal to or less than one;

(d) a main semiconductor region formed on the multilayered buffer region, the main semiconductor region constituting a primary working part of the semiconductor device;

(e) a first electrode formed on the main semiconductor region; and (f) a second electrode formed on the other of the pair of opposite major surfaces of the substrate, wherein the n-type nitride semiconductor region makes such contact with the substrate as to provide a current path from the n-type nitride semiconductor region to the substrate.

9. A nitride-based semiconductor device as defined in claim 8, wherein the semiconductor device is a light-emitting diode, wherein the main semiconductor region comprises an active layer and a p-type nitride semiconductor layer formed thereon, wherein the first electrode is an anode electrically connected to the p-type nitride semiconductor layer of the main semiconductor region, and wherein the second electrode is a cathode.

10. A nitride-based semiconductor device as defined in claim 9, wherein the first electrode comprises a transparent overlay formed on the p-type nitride semiconductor layer of the main semiconductor region, and a bonding pad formed on the transparent overlay.

11. A nitride-based semiconductor device as defined in claim 9, wherein the main semiconductor device further comprises an n-type nitride semiconductor layer on the p-type nitride semiconductor layer, and wherein the first electrode comprises a transparent overlay formed on the n-type nitride semiconductor layer of the main semiconductor region, and a bonding pad formed on the transparent overlay.

12. A nitride-based semiconductor device as defined in claim 8, wherein the semiconductor device is a transistor, wherein the main semiconductor region comprises a p-type base subregion and an n-type emitter subregion, wherein the first electrode is an emitter electrode electrically connected to the n-type emitter subregion of the main semiconductor region, wherein the second electrode is a collector electrode, and wherein the transistor further comprises a base electrode electrically connected to the p-type nitride base subregion of the main semiconductor region.

13. A nitride-based semiconductor device as defined in claim 8, wherein the semiconductor device is an insulated-gate field-effect transistor, wherein the main semiconductor region comprises a p-type body subregion and an n-type source subregion disposed contiguous to each other, wherein the first electrode is a source electrode electrically connected to the n-type source subregion of the main semiconductor region, wherein the second electrode is a drain electrode, and wherein the insulated-gate field-effect transistor further comprises a gate electrode.

14. A light-emitting diode as defined in claim 7, wherein the first layers are each thick enough to provide a quantum mechanical tunnel effect and made from any of nitrides that are generally defined by the formula:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one; and wherein the second layers are made from any of nitrides that are generally defined by the formula:

$$Al_aM_bGa_{1-a-b}N$$

where M is at least either of indium and boron; the subscript a is a numeral that is equal to or greater than zero, less than one, and less than x in the formula above generally defining the composition of the first layers; the subscript b is a numeral that is equal to or greater than zero and equal to or less than one; and the sum of a and b is equal to or less than one.

* * * * *